(12) United States Patent
Kim et al.

(10) Patent No.: US 11,925,047 B2
(45) Date of Patent: Mar. 5, 2024

(54) LIGHT-EMITTING DEVICE AND DISPLAY DEVICE USING THE SAME

(71) Applicant: LG Display Co., Ltd., Seoul (KR)

(72) Inventors: Chun Ki Kim, Seoul (KR); Jung Keun Kim, Seoul (KR); Yu Jeong Lee, Seoul (KR); Wook Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 303 days.

(21) Appl. No.: 17/331,406

(22) Filed: May 26, 2021

(65) Prior Publication Data

US 2022/0209200 A1    Jun. 30, 2022

(30) Foreign Application Priority Data

Dec. 31, 2020   (KR) .................. 10-2020-0190049

(51) Int. Cl.
*H10K 50/19* (2023.01)
*H10K 50/11* (2023.01)
*H10K 59/12* (2023.01)
*H10K 59/38* (2023.01)
*H10K 101/10* (2023.01)
*H10K 101/30* (2023.01)
*H10K 101/00* (2023.01)
*H10K 102/00* (2023.01)

(52) U.S. Cl.
CPC .............. *H10K 50/19* (2023.02); *H10K 50/11* (2023.02); *H10K 59/12* (2023.02); *H10K 59/38* (2023.02); *H10K 2101/10* (2023.02); *H10K 2101/30* (2023.02); *H10K 2101/90* (2023.02); *H10K 2102/3035* (2023.02)

(58) Field of Classification Search
CPC ........ H10K 50/19; H10K 50/11; H10K 59/12; H10K 59/38; H10K 2101/10; H10K 2101/30; H10K 2101/90; H10K 2102/3035; H10K 50/13; H10K 30/865; H10K 2101/40; H10K 50/125; H10K 59/122; H10K 50/12; H10K 85/60; H10K 85/615; H10K 85/622; H10K 10/10; H10K 19/00; H10K 30/00; H10K 39/00; H10K 50/00; H10K 59/00; H10K 65/00; H10K 71/00; H10K 77/00; H10K 85/00; H10K 99/10; H10K 2101/00; H10K 2102/00

See application file for complete search history.

(56) References Cited

U.S. PATENT DOCUMENTS 11,575,087 B1 *   2/2023   Toyoshima ............ H10K 85/40
2006/0214553 A1   9/2006   Nagara et al.
(Continued)

FOREIGN PATENT DOCUMENTS

KR         10-0729199 B1     6/2007

*Primary Examiner* — Mohammad A Rahman
(74) *Attorney, Agent, or Firm* — Fenwick & West LLP

(57) ABSTRACT

Disclosed are a light-emitting device and a display device including the same. An emissive layer is formed so as to have a dual-layer structure, the triplet energy level of a dopant of a first emissive layer adjacent to a hole transport layer is greater than the triplet energy level of a first host in the first emissive layer, and the triplet energy level of the first host is greater than the triplet energy level of a second host of a second emissive layer, whereby triplet excitons generated in the first emissive layer are recycled to the second emissive layer so as to be reused for light emission.

19 Claims, 7 Drawing Sheets

(56) References Cited

U.S. PATENT DOCUMENTS

| | | | |
|---|---|---|---|
| 2014/0034922 A1* | 2/2014 | Song | H10K 85/654 |
| | | | 257/40 |
| 2015/0228223 A1* | 8/2015 | Park | H10K 59/353 |
| | | | 345/77 |
| 2020/0058874 A1* | 2/2020 | Kim | H10K 85/657 |
| 2021/0130355 A1* | 5/2021 | Gao | H10K 85/654 |
| 2022/0102648 A1* | 3/2022 | Wang | H10K 85/654 |
| 2022/0416171 A1* | 12/2022 | Tasaki | C09K 11/06 |

\* cited by examiner

LIGHT-EMITTING DEVICE AND DISPLAY DEVICE USING THE SAME

CROSS-REFERENCE TO RELATED APPLICATION

This application claims the benefit of Korean Patent Application No. 10-2020-0190049, filed on Dec. 31, 2020, which is hereby incorporated by reference as if fully set forth herein.

BACKGROUND OF THE INVENTION

Field of the Invention

The present invention relates to a light-emitting device, and more particularly to a light-emitting device configured such that the construction of an emissive layer is changed such that excitons generated in the emissive layer are recycled so as to be reused for light emission, whereby it is possible to prevent excitons from accumulating at an interface between adjacent components, and therefore both the efficiency and lifespan of the light-emitting device are improved, and a display device using the same.

Discussion of the Related Art

Recently, an organic light-emitting display device has been considered a competitive application because it does not require a separate light source and enables realization of a compact device design and vivid color display.

Meanwhile, the organic light-emitting display device includes a plurality of subpixels, wherein each subpixel includes an organic light-emitting device in order to emit light without a separate light source.

In recent years, research on a tandem device commonly constituting an organic layer and an emissive layer without a deposition mask, which is provided in the organic light-emitting device, has been conducted.

In the light-emitting device, a host that exhibits high electron transportability in an emissive layer pushes electrons towards a hole transport layer, whereby a recombination region of holes and electrons is thinly generated at the interface between an electron transport layer and an emissive layer distant therefrom. In this case, electrons are accumulated at one interface of the emissive layer, whereby the lifespan of the hole transport layer or an electron blocking layer abutting the interface may be abruptly deteriorated.

SUMMARY OF THE INVENTION

Accordingly, the present invention is directed to a light-emitting device and a display device using the same that substantially obviate one or more problems due to limitations and disadvantages of the related art.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light-emitting device and a display device are configured such that an emissive layer is formed so as to have a dual-layer structure, the triplet energy level of a dopant of a first emissive layer adjacent to a hole transport layer is greater than the triplet energy level of a first host in the first emissive layer, and the triplet energy level of the first host is greater than the triplet energy level of a second host of a second emissive layer, whereby triplet excitons generated in the first emissive layer are recycled to the second emissive layer so as to be reused for light emission.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Figure 1:
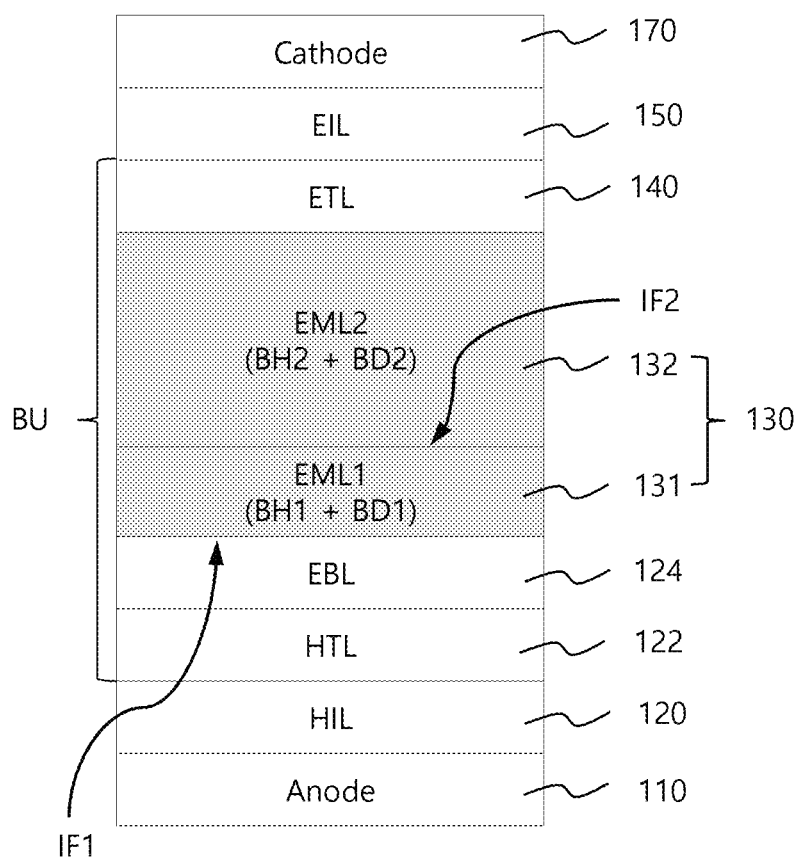
FIG. 1 is a sectional view showing a light-emitting device according to the present invention.

Hereinafter, embodiments will be described with reference to the accompanying drawings. In the drawings, the same or similar elements are denoted by the same reference numerals even though they are depicted in different drawings. In the following description, a detailed description of known functions and configurations incorporated herein will be omitted when it may make the subject matter of the disclosure rather unclear. In addition, names of components used in the following description are selected in consideration of ease in preparing the specification, and may be different from names of parts of an actual product.

In the drawings for explaining the exemplary embodiments of the present invention, for example, the illustrated shape, size, ratio, angle, and number are given by way of example, and thus, are not limitative of the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises", "includes", and/or "has", used in this specification, do not preclude the presence or addition of other elements unless used along with the term "only." The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts may be located between the two parts unless the term "directly" or "closely" is used therewith.

In the description of the various embodiments of the present invention, when describing temporal relationships, for example, when the temporal relationship between two actions is described using "after", "subsequently", "next", "before", or the like, the actions may not occur in succession unless the term "immediately" or "directly" is used therewith.

In the description of the various embodiments of the present invention, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present invention unless otherwise mentioned.

The respective features of the various embodiments of the present invention may be partially or wholly coupled to and combined with each other, and various technical linkages therebetween and operation methods thereof are possible. These various embodiments may be performed independently of each other, or may be performed in association with each other.

In this specification, the "lowest unoccupied molecular orbital (LUMO) energy level" and the "highest occupied molecular orbital (HOMO) energy level" of any layer mean the LUMO energy level and the HOMO energy level of the material that occupies the greatest weight percentage of the corresponding layer, for example, a host material, unless they are referred to as the LUMO energy level and the HOMO energy level of a dopant material that is doped in the corresponding layer.

In this specification, the "HOMO energy level" is obtained by irradiating a surface with UV light and measuring energy necessary for electrons to be discharged from the surface. That is, discharged photoelectrons are measured using an electrometer, and a threshold of photoelectron emission is extrapolated from an irradiated photon energy curve of emission of the resulting photoelectron emission in order to measure the HOMO energy level.

In addition, the HOMO and LUMO energy levels compared in this specification are based on a vacuum level, and are negative values. Therefore, that one is lower than another means that one is lower than another based on the vacuum level, and the lower one has a larger absolute value.

An energy band gap Eg is obtained by measuring a UV absorption spectrum, drawing a tangent line to a rising edge having a long wavelength of the absorption spectrum, and converting a wavelength, which is an intersection point with a traverse axis, into an energy value ($E=h\nu/\lambda=h*C/\lambda$, where h is the Planck constant, C is the speed of light, and $\lambda$ is the wavelength of light).

In this specification, the term "doped" means that a material of any layer, which has physical properties (e.g., N-type and P-type, or an organic material and an inorganic material) different from the material that occupies the greatest weight percentage of the corresponding layer, is added to the material accounting for the greatest weight percentage in an amount corresponding to a weight percentage of less than 30%. In other words, a "doped" layer means a layer in which a host material and a dopant material of any layer are distinguishable from each other in consideration of the weight percentages thereof. In addition, the term "undoped" refers to all cases excluding the case that corresponds to the term "doped". For example, when any layer is formed of a single material or is formed of a mixture of materials having the same or similar properties, the layer is an "undoped" layer. For example, when at least one of constituent materials of any layer is of a P-type and not all of the other constituent materials of the layer are of an N-type, the layer is an "undoped" layer. For example, when at least one of the constituent materials of any layer is an organic material and not all of the other constituent materials of the layer are an inorganic material, the layer is an "undoped" layer. For example, when all constituent materials of any layer are organic materials, at least one of the constituent materials is of an N-type, at least another constituent material is of a P-type, and the weight percent of the N-type material is less than 30% or the weight percent of the P-type material is less than 30%, the layer is a "doped" layer.

Meanwhile, in this specification, an electroluminescence (EL) spectrum is calculated via the product of (1) a photoluminescence (PL) spectrum that represents unique properties or an emissive material such as a dopant or host material included in an organic emissive layer and (2) an outcoupling emittance spectrum curve determined depending on the structure and optical properties of an organic light-emitting device including thicknesses of organic layers such as an electron transport layer.

Figure 2:
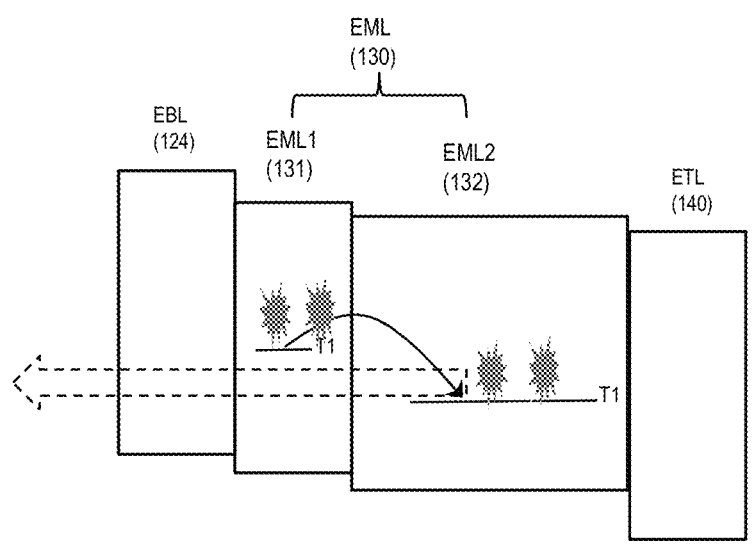
FIG. 2 is an energy band diagram of a light-emitting unit of FIG. 1 and layers in the vicinity thereof.

FIG. 1 is a sectional view showing a light-emitting device according to the present invention, and FIG. 2 is an energy band diagram of a light-emitting unit of FIG. 1 and layers in the vicinity thereof.

As shown in FIGS. 1 and 2, a light-emitting device according to an embodiment of the present invention includes an electron blocking layer (EBL) 124, a first emissive layer 131, a second emissive layer 132, and an electron transport layer (ETL) 140, which are sequentially disposed, between a first electrode (for example, an anode) 110 and a second electrode (for example, a cathode) 170, which are opposite each other. The first emissive layer 131 includes a first host BH1 and a first blue dopant BD1. The second emissive layer 132 includes a second host BH2 and a second blue dopant BD2. In the followings, the first emissive layer 131 can also be indicated by EML1, and the second emissive layer 132 can also be indicated by EML2.

The first and second emissive layers 131 and 132 emit blue light together. For this reason, the first and second emissive layers are commonly called a light-emitting unit 130.

Referring to the energy band diagram of FIG. 2, the light-emitting unit 130 is a set of emissive layers configured to emit blue light. The first emissive layer 131 and the second emissive layer 132 include first and second hosts BH1 and BH2, which are made of different materials, respectively.

Since the first host BH1 of the first emissive layer 131 has better hole transport properties than the second host BH2 of the second emissive layer 132, the first host BH1 prevents electrons from accumulating at an interface IF1 of the electron blocking layer 124 located in front of the first emissive layer 131, whereby it is possible to prevent deterioration of the electron blocking layer 124 abutting the light-emitting unit 130. Consequently, it is possible to increase the lifespan of the light-emitting device.

The light-emitting unit 130 is divided into two or more layers based on at least host materials. Excitons are recycled to the side adjacent to the electron transport layer 140, and the second emissive layer 132 adjacent to the electron transport layer 140 uses the recycled excitons for light emission. To this end, both triplet energy levels $T_1(BH1)$ and $T_1(BD1)$ of the first host BH1 and the first blue dopant BD1 constituting the first emissive layer 131 are higher than a triplet energy level $T_1(BH2)$ of the second host BH2 of the second emissive layer 132.

Also, in the second host BH2 of the second emissive layer 132, triplet-triplet fusion (TTF) is possible. In the light-emitting unit BU, triplet excitons transferred to the second emissive layer 132 are fused, whereby fluorescence emission, which is main emission, is achieved.

In the case in which a plurality of emissive layers are used in the light-emitting unit 130, efficiency may be reduced due to an increase in transfer of holes. However, triplet excitons in the first emissive layer 131 are transferred to the second emissive layer 132 such that the triplet excitons can be reused for light emission, whereby efficiency improvement is expected.

The second emissive layer 132 may include a second host BH2 having good electron transport properties and a second blue dopant BD2 exhibiting hole trapability. In this case, the electron transport layer 140, which increases transfer of electrons, mainly generates a recombination region of holes and electrons at an interface IF2 between the first and second emissive layers 131 and 132, whereby it is possible to prevent excitons from accumulating at the interface with the electron blocking layer 124, whereby the lifespan of the light-emission device may be increased.

The light-emission device according to the present invention is characterized in that the second emissive layer 132, which functions as main emission, is provided in the light-emission unit 130 and the first emissive layer 131, which exhibits good hole transport properties and recycles excitons so as to be reused, is provided between the second emissive layer 132 and the electron blocking layer 124.

The first emissive layer 131, which exhibits high hole transport properties, inhibits deterioration of the electron blocking layer 124. As shown in FIG. 2, the triplet energy level $T_1(BH1)$ of the first host BH1 is designed to be higher than the triplet energy level $T_1(BH2)$ of the second host BH2, whereby it is possible to maintain high efficiency through reuse of triplet excitons.

Meanwhile, in the above structure, the first emissive layer 131 of the light-emission unit 130 abuts the electron blocking layer 124.

However, the present invention is not limited thereto. The emissive layer 131 of the light-emission unit 130 may directly abut a hole transport layer (HTL) 122 without the electron blocking layer (EBL) 124. In this case, the hole transport layer 122 may be constituted by a plurality of layers.

A hole injection layer (HIL) 120 and the hole transport layer 122 may be further provided between the first electrode 110 and the electron blocking layer 124, whereby it is possible to adjust the injection and transport of holes from the first electrode (anode) 110.

The electron transport layer (ETL) 140 and an electron injection layer (EIL) 150 may be further provided between the light-emission unit 130 and the second electrode (cathode) 170.

For example, the emission unit BU, the hole transport layer 122 and the electron blocking layer 124 disposed under the light-emission unit 130, and the electron transport layer 140 disposed on the light-emission unit 130 may constitute a blue stack BU. For example, when a plurality of stacks is provided between the first electrode 110 and the second electrode 170 in the state of being divided by a charge generation layer, the blue stack BU may be provided as at least one of the stacks.

Meanwhile, all of the components from the first electrode 110 to the second electrode 170 may form an organic light-emitting device (OLED).

Meanwhile, in FIG. 2, the arrow indicates the direction of light emission. As an example, downward light emission is shown. The first electrode 110 is a transparent electrode, and the second electrode 170 is a reflective electrode. However, the present invention is not limited thereto. Upward light emission is also possible. In the upward light emission, the first electrode 110 may be a reflective electrode, and the second electrode 170 may be a transparent electrode or a reflective and transmissive electrode.

Hereinafter, functions of light-emitting devices according to embodiments of the present invention will be described in more detail.

Classification into first and second embodiments is based on whether the dopants BD1 and BD2 of the first and second emissive layers are made of the same material.

First, the case in which the dopants BD1 and BD2 of the first and second emissive layers are made of the same material will be described through the first embodiment.

Figure 3:
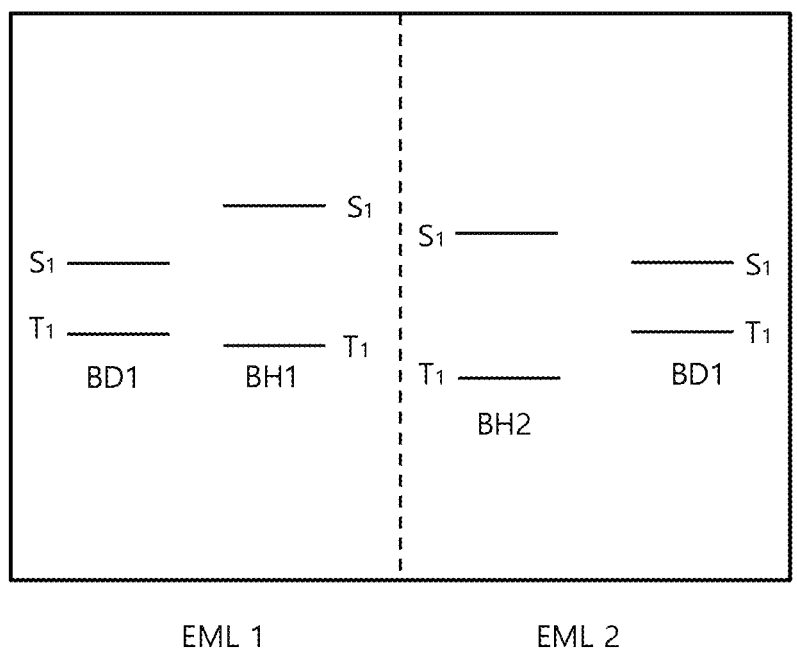
FIG. 3 is a view showing a relationship between a singlet energy level and a triplet energy level for each material in a light-emitting unit of a light-emitting device according to a first embodiment of the present invention.

FIG. 3 is a view showing a relationship between a singlet energy level and a triplet energy level for each material in a light-emitting unit of a light-emitting device according to a first embodiment of the present invention.

As shown in FIG. 3, the light-emitting unit according to the first embodiment of the present invention includes a first emissive layer EML1 and a second emissive layer EML2 configured to emit blue light. The first emissive layer EML1 includes a first host BH1 and a first blue dopant BD1. The second emissive layer EML2 includes a second host BH2 and a second blue dopant BD2. In the first embodiment, the first and second blue dopants BD1 and BD2 are made of the same material. In the following description of the first embodiment, the first and second blue dopants BD1 and BD2 will be simply referred to as blue dopants BD.

For main emission in the second emissive layer EML2, the second host BH2 in the second emissive layer EML2 must successfully receive energy from the first emissive layer EML1.

In this aspect, the triplet energy level $T_1(BD)$ of the blue dopant BD is greater than the triplet energy level $T_1(BH1)$ of the first host BH1, the triplet energy level $T_1(BH1)$ of the first host BH1 is greater than 2.0 eV, and the triplet energy level $T_1(BH2)$ of the second host BH2 is less than 2.0 eV. That is, the following relationship must be satisfied.

$$T_1(BD) > T_1(BH1) > 2.0 \text{ eV} > T_1(BH2)$$

In addition, the singlet energy level $S_1(BH1)$ of the first host BH1 is greater than the singlet energy level $S_1$ (BH2) of the second host BH2, and the singlet energy level $S_1$ (BH2) of the second host BH2 is greater than the singlet energy level $S_1$ (BD) of the dopant.

That is, the condition of $S_1(BH1) > S_1 (BH2) > S_1(BD)$ is satisfied.

In the light-emitting device according to the first embodiment, each of the first emissive layer 131 and the second emissive layer 132 may further include a host. Essentially, however, the first emissive layer 131 and the second emissive layer 132 must include a first host, a second host, and blue dopants having the above relationship.

Here, the triplet energy level $T_1(BD)$ of the blue dopant BD included in the first emissive layer 131 is greater than the triplet energy levels of the first and second hosts BH1 and BH2, and exceeds 2.0 eV.

In addition, the singlet energy level $S_1(BD)$ of the blue dopant included in the first emissive layer 131 is less than the singlet energy levels of the first and second hosts BH1 and BH2. As a result, the value of ΔEst $(S_1-T_1)$ of the blue dopant is small.

In the light-emitting device according to the present invention, the thickness of the light-emitting unit 130 is not increased although a plurality of emissive layer is provided. For example, the first and second emission layers 131, 132 are provided in the light-emission unit 130 of the present invention, and the materials for the first host (BH1), and the blue dopant (BD) included in the first emissive layer and the materials for the second host (BH2), and the blue dopant (BD) in the second emissive layer satisfy the conditions of $T_1(BD) > T_1(BH1) > 2.0$ eV $> T_1(BH2)$ and $S_1(BH1) > S_1(BH2) > S_1(BD)$. By the relations of the triplet energy levels and singlet energy levels between the first emissive layer and the second emissive layer, electrons or excitons are pushed such that a recombination region is concentrated on the emissive layer located at the rear end of the limited light-emitting unit BU, whereby it is possible to prevent the electrons or the excitons from accumulating at the interface IF1 with the electron blocking layer or the hole transport layer, and therefore it is possible to increase the lifespan of the device.

Meanwhile, the first host BH1 of the first emissive layer EML1, which has hole transportability, may be p-type or bipolar. In order to continuously supply excitons and holes to the second emissive layer 132, hole mobility of the first host BH1 may be greater than hole mobility of the second host BH2.

The first emissive layer 131 and the second emissive layer 132 may be configured to abut each other. In this case, the thickness of the second emissive layer 132 may be equal to or greater than the thickness of the first emissive layer 131.

Depending on circumstances, a mixed region in which different hosts BH1 and BH2 of the two emissive layers are mixed with each other, may be further provided between the first emissive layer 131 and the second emissive layer 132 such that the recombination region is spaced apart from the electron blocking layer or the hole transport layer and the electron transport layer, whereby it is possible to further increase the lifespan of the light-emitting device.

When the first host BH1 has hole transport properties, the HOMO energy level of the first host may be −6.0 eV to −5.6 eV, the LUMO energy level of the first host BH1 may be higher than −2.6 eV, and the LUMO energy level of the blue dopant BD may be lower than the LUMO energy level of the first host BH1. All of the HOMO and LUMO energy levels are negative values, which are compared with a vacuum level.

The first host BH1 may include a naphthalene moiety but is not anthracene, pyrene, or phenanthrene, which are aromatic hydrocarbons. In contrast, the second host BH2 may include one of anthracene, pyrene, and phenanthrene.

As needed, the blue dopants may be of the same kind, or different dopants may be used.

The case in which different dopants are used will be described with reference to FIG. 4.

Figure 4:
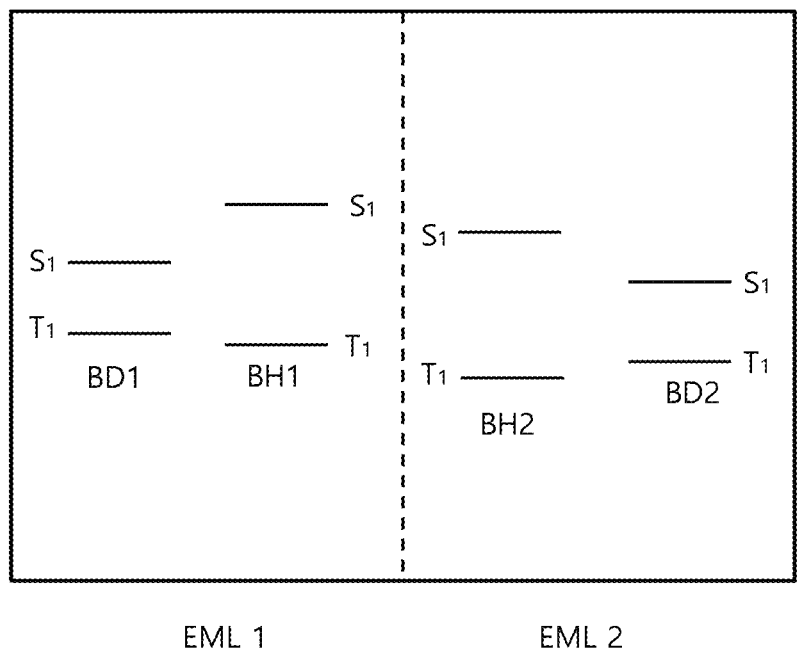
FIG. 4 is a view showing a relationship between a singlet energy level and a triplet energy level for each material in a light-emitting unit of a light-emitting device according to a second embodiment of the present invention.

FIG. 4 is a view showing a relationship between a singlet energy level and a triplet energy level for each material in a light-emitting unit of a light-emitting device according to a second embodiment of the present invention.

In the case in which different blue dopants BD1 and BD2 are used in the first and second emissive layers 131 and 132, the first blue dopant BD1 included in the first emissive layer 131 has the following characteristics.

That is, the HOMO level of the first blue dopant BD1 must be greater than −5.3 eV. The emission spectrum of the first blue dopant BD1 is less than the absorption spectrum of the second blue dopant BD2. Consequently, energy is mainly transferred from the first blue dopant BD1 to the second blue dopant BD2 in a region in which the emission spectrum of the first blue dopant BD1 and the absorption spectrum of the second blue dopant BD2 overlap each other, whereby main emission occurs in the second emissive layer 132.

In addition, the triplet energy level $T_1(BD1)$ of the first blue dopant satisfies the following relationship.

$$T_1(BD1) > T_1(BH1) > T_1(BD2) > T_1(BH2)$$

Due to the relationship between triplet energy levels of materials in the first and second emissive layers, concentration of single and triplet excitons is brought to the interface between the first and the second emissive layers, thereby improving lifespan of the light emitting device.

Hereinafter, the light-emitting device according to the present invention will be described with reference to various experimental examples.

In the following experimental examples, a stack structure is configured by sequentially depositing a hole injection layer 120 having a thickness of 70Å, a hole transport layer 122 having a thickness of 850Å, an electron blocking layer 124 having a thickness of 150Å, an emissive layer or the light-emission unit 130 having a thickness of 200Å, an electron transport layer 140 having a thickness of 150Å, an electron injection layer 150 having a thickness of 170Å, and a cathode 170, which is a reflective aluminum electrode, on a substrate including indium tin oxide (ITO) as the first electrode 110 of FIG. 1.

The concentration of the dopant in the first and second emissive layers or a single emissive layer was 2 vol % of that of the emissive layer or the light-emission unit, and driving voltage was evaluated under a condition of 10 mA/cm².

TABLE 1

| Classification | Structure (EBL:BU) + ETLb | Driving voltage (V) | Efficiency (%) | EQE (%) | CIEx | CIEy | Lifespan (T95) (%) |
|---|---|---|---|---|---|---|---|
| Ex1 | EBL:Single EML | 0.000 | 100 | 100 | 0.000 | 0.000 | 100 |
| Ex2 | EBL:Single EML:Modified ETLa | −0.110 | 121 | 124 | 0.000 | −0.002 | 38 |
| Ex3 | EBLa:Single EML | −0.292 | 99 | 94 | 0.000 | 0.002 | 120 |
| Ex4 | $T_1$ (BH1) < 2.0 eV, BU (20/180) | 0.000 | 98 | 99 | 0.000 | 0.000 | 99 |
| Ex5 | $T_1$ (BH1) < 2.0 eV, BU (40/160) | 0.000 | 97 | 98 | 0.000 | 0.000 | 95 |
| Ex6 | $T_1$ (BH1) < 2.0 eV, BU (80/180) | 0.000 | 93 | 97 | 0.000 | 0.000 | 92 |

In the first to sixth experimental examples Ex1 to Ex6, the light-emitting device of FIG. 1 was tested. In the first to third experimental examples Ex1 to Ex3, a single emissive layer was used instead of the light-emission unit. In the fourth to sixth experimental examples Ex4 to Ex6, the first host of the first emissive layer was made of a material having a triplet energy level of 2.0 eV or less, and therefore the light-emission unit according to the present invention was made of a material having low hole transportability. First, the experimental examples shown in Table 1 above and Table 2 below were compared with the first experimental example Ex1 having the single emissive layer applied thereto. In the first to third experimental examples Ex1 to Ex3, experiments were carried out under the condition in which the thickness of the single emissive layer was 200Å. In the fourth to sixth experimental examples Ex4 to Ex6, experiments were carried out under the condition in which the thickness of the light-emission unit constituted by the dual emissive layers was 200Å, in the same manner.

In the second experimental example Ex2, the emissive layer is a single layer, and the electron transport layer (ETLa) abutting the emissive layer is made of a material that exhibits high electron transportability. In the first and third to sixth experimental examples Ex1, and Ex3-Ex6, an electron transport layer ETLb having general electron transportability is provided to each light emission unit. In the second experimental example Ex2, the efficiency of the device is increased but the lifespan of the device is remarkably decreased. The reason for this is that electrons are accumulated at the interface between the electron blocking layer and the emissive layer, whereby deterioration of the electron blocking layer occurs.

In the Tables, EQE (%) means an external quantum efficiency of each experimental examples compared to the external quantum efficiency of the first experimental example Ex1. CIEx and CIEy are color coordinate values of each experimental examples compared to the color coordinate values of the first experimental example Ex1.

In the third experimental example Ex3, the emissive layer is a single layer, and the material for the electron blocking layer abutting the emissive layer is changed in order to improve electron transportability. In this case, electron transportability is improved by changing the material for the electron blocking layer, whereby lifespan is increased but efficiency is decreased. The reason for this is that a recombination region is widely formed due to an increase in hole current, whereby TTF efficiency is decreased and thus efficiency is decreased. The density of electrons toward the electron blocking layer and the emissive layer is reduced, whereby deterioration of the electron blocking layer is decreased and thus lifespan is increased.

In all of the first to third experimental examples Ex1 to Ex3, both lifespan and efficiency are not increased.

In the fourth to sixth experimental examples Ex4 to Ex6, the emissive layer has a dual-layer structure, the host of the first emissive layer is made of a material having a triplet energy level of 2.0 eV or less, and the thickness ratio of the first and second emissive layers is adjusted for evaluation.

In the fourth to sixth experimental examples Ex4 to Ex6, however, both efficiency and lifespan are somewhat reduced, compared to the first experimental example Ex1.

In seventh to thirteenth experimental examples shown in Table 2 below, the materials for the first host (BH1), and the blue dopant (BD) included in the first emissive layer and the materials for the second host (BH2), and the blue dopant (BD) in the second emissive layer satisfy the conditions of $T_1(BD) > T_1(BH1) > 2.0$ eV $> T_1(BH2)$ and $S_1(BH1) > S_1(BH2) > S_1(BD)$ used in the present invention.

TABLE 2

| Classification | Structure (BU [EML1:EML2]) | Driving voltage (V) | Efficiency (%) | EQE (%) | CIEx | CIEy | Lifespan (T95) (%) |
|---|---|---|---|---|---|---|---|
| Ex7 | EML1 (No BD)/[50:150] | −0.160 | 93 | 89 | 0.000 | 0.005 | 67 |
| Ex8 | [20:180] | −0.067 | 104 | 100 | −0.001 | 0.004 | 128 |
| Ex9 | [40:160] | −0.133 | 105 | 100 | −0.001 | 0.005 | 140 |
| Ex10 | [80:120] | −0.198 | 105 | 97 | −0.002 | 0.008 | 163 |
| Ex11 | [120:80] | −0.256 | 100 | 91 | −0.003 | 0.011 | 144 |
| Ex12 | [EML1:Mixed:EML2] | −0.151 | 93 | 84 | −0.001 | 0.008 | 209 |
| Ex13 | No EBL/[80:120] | −0.516 | 94 | 87 | −0.002 | 0.008 | 103 |

In the seventh experimental example Ex7, the first emissive layer includes a first host having a large triplet energy level without a dopant, and the thicknesses of the first emissive layer and the second emissive layer are 50Å and 150Å, respectively. In the seventh experimental example Ex7, efficiency and lifespan are lower than in the first experimental example Ex1. In addition, lifespan and efficiency are lower than in the eighth to eleventh experimental examples Ex8 to Ex11.

In the eighth to eleventh experimental examples Ex8 to Ex11, therefore, the function of the blue dopant BD included in the first emissive layer EML1 may be analogized. That is, it may be analogized that, among excitons generated in the first emissive layer EML1, triplet excitons are transmitted to the second emissive layer EML2 through Dexter energy transfer and that radiative decay process of singlet excitons through the blue dopant BD contributes to lifespan and efficiency.

The light emission structure described with reference to FIGS. 1 to 4 is applied to the eighth to eleventh experimental examples Ex8 to Ex11.

In the eighth and ninth experimental examples Ex8 and Ex9, it is determined that lifespan improvement is possible without a decrease in efficiency in the case in which thickness of the first emissive layer EML1 is up to 40Å.

As can be seen from the third experimental example Ex3, lifespan improvement due to an increase in hole current is accompanied with efficiency reduction. In the eighth and ninth experimental examples Ex8 and Ex9, efficiency reduction due to hole current is offset by contribution to light emission in the first emissive layer EML1, whereby lifespan improvement of the device is possible without efficiency reduction.

In the tenth and eleventh experimental examples Ex10 and Ex11, the thickness of the first emissive layer EML1 is increased, and therefore efficiency reduction due to an increase in hole current is greater than contribution to light emission in the first emissive layer EML1. Consequently, a relative decrease in efficiency occurs, compared to the eighth and ninth experimental examples Ex8 and Ex9.

It can be seen from the eighth to eleventh experimental examples Ex8 to Ex11 that, when the thickness ratio of the first emissive layer to the second emissive layer is 1:9 to 6:4, lifespan improvement is achieved without an increase in efficiency.

Meanwhile, in the twelfth experimental example Ex12, two kinds of hosts are included between the first and second emissive layers EML1 and EML2 having different hosts BH1 and BH2 and blue dopants are provided. In this case, the concentration of the second host BH2 in the light-emission unit 130 is reduced, whereby efficiency is decreased, compared to the first experimental example Ex1. However, the twelfth experimental example Ex12 is meaningful in that lifespan is twice or more that of the first experimental example Ex1, whereby the light-emitting device can be driven for a long time.

Consequently, it can be seen that exciton density must be lowered for lifespan improvement.

Meanwhile, the first host BH1 of the first emissive layer is a material that exhibits good hole current properties. For structural simplification, therefore, an example in which the electron blocking layer was removed was evaluated in the thirteenth experimental example Ex13. In the thirteenth experimental example Ex13, lifespan is maintained at the level of the first experimental example Ex1, but efficiency is decreased. The reason for this is that, when the electron blocking layer is removed, efficiency is decreased due to an abrupt increase in hole current.

As shown in Table 2 above, therefore, it can be seen that the eighth to eleventh experimental examples Ex8 to Ex11, each of which has the structure according to the present invention of FIG. 1, have effects in both efficiency and lifespan. Also, in the case in which a mixed region in which the hosts included in the first and second emissive layers are mixed with each other is further provided between the first and second emissive layers, as in the twelfth experimental example Ex12, it can be seen that lifespan is remarkably increased.

Through the above experiments, it is possible to confirm the effect caused by different hosts of the first and second emissive layers according to the present invention having a specific triplet energy level relationship for each material.

In a light-emitting device according to the present invention, an emissive layer configured to emit blue light is formed so as to have a dual-layer structure, the triplet energy level of a dopant of a first emissive layer adjacent to a hole transport layer is greater than the triplet energy level of a first host in the first emissive layer, and the triplet energy level of the first host is greater than the triplet energy level of a second host of a second emissive layer, whereby triplet excitons generated in the first emissive layer are recycled to the second emissive layer so as to be reused for light emission. That is, excitons or electrons may be prevented from accumulating at the interface between the hole transport layer or an electron blocking layer and the emissive layer. Consequently, it is possible to improve efficiency of the light-emitting device and to remarkably increase lifespan of the light-emitting device.

The first emissive layer adjacent to the hole transport layer has a host having hole transportability, whereby holes are pushed to the second emissive layer. Consequently, the recycling rate of triplet excitons in the second emissive layer is increased, whereby it is possible to prevent excitons or electrons from accumulating at the interface between the hole transport layer or the electron blocking layer and the first emissive layer, and therefore it is possible to increase the lifespan of the hole transport layer or the electron blocking layer.

In addition, continuous recycling from the first emissive layer to the second emissive layer, which constitutes a plural-layer structure with the first emissive layer, is performed, whereby it is possible to maintain high efficiency, and therefore it is possible to increase the lifespan of the light-emitting device and the display device and to stabilize the device.

Meanwhile, in the light-emitting device of FIG. 1, the blue stack BU, which includes the hole transport layer 122, the electron blocking layer 124, the light-emission unit 130 constituted by the first and second emissive layers EML1 and EML2 that are stacked, and the electron transport layer 140, may be coupled to another stack between the first electrode 110 and the second electrode 170 in the state in which a charge generation layer CGL is interposed therebetween.

An example will be described with reference to the drawings.

Figure 5A:
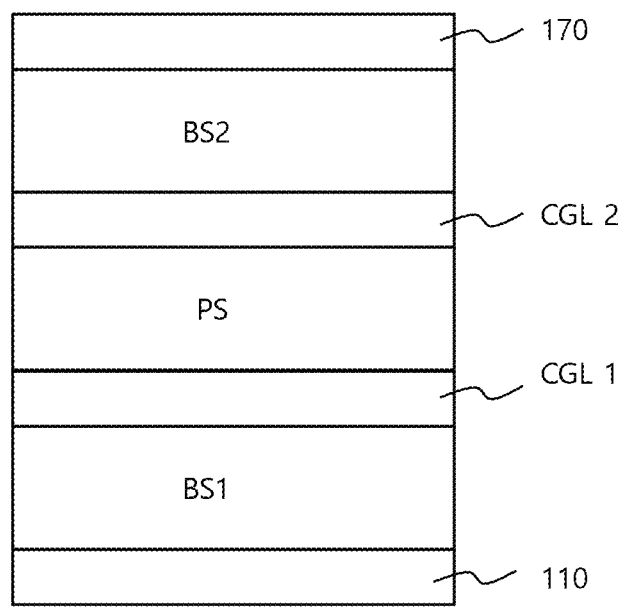
FIGS. 5A and 5B are sectional views showing white organic light-emitting devices according to other embodiments of the present invention.
Figure 5B:
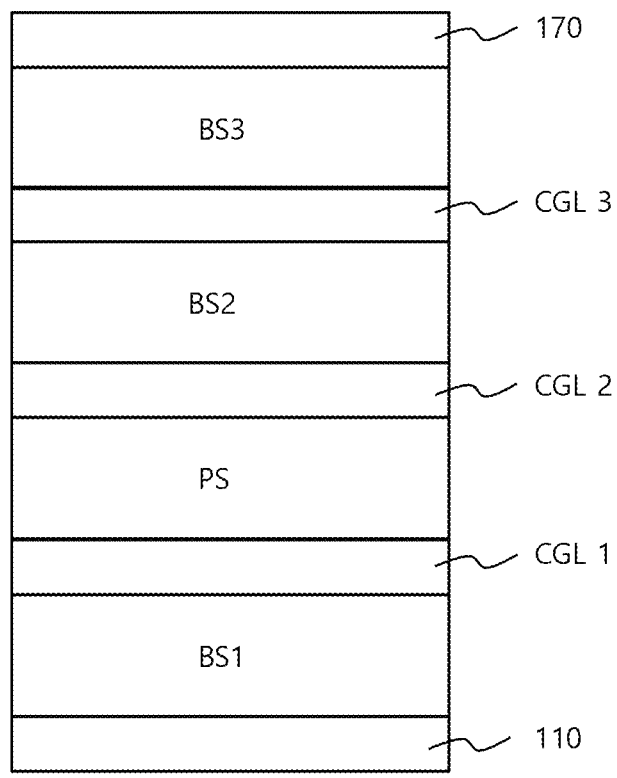

FIGS. 5A and 5B are sectional views showing white organic light-emitting devices according to other embodiments of the present invention.

FIG. 5A shows a white organic light-emitting device according to another embodiment of the present invention. A first blue emissive stack BS1, a phosphorescent emissive stack PS, and a second blue emissive stack BS2 are sequentially provided between a first electrode 110 and a second electrode 170. Charge generation layers CGL1 and CGL2 configured to supply holes and electrons to emissive stacks distant from the electrodes may be further provided between the emissive stacks BS1, PS, and BS2.

The phosphorescent emissive stack PS may include a stack of two or more phosphorescent emissive layers configured to emit different colors, such as a stack of a red emissive layer and a green emissive layer or a stack of a yellowish green emissive layer and a green emissive layer. In the shown example, the phosphorescent emissive stack PS is disposed as the middle stack. However, the present invention is not limited thereto. The phosphorescent emissive stack PS may be disposed so as to be adjacent to the first electrode 110 or the second electrode 170.

In addition, the blue stack shown in FIG. 1 may be applied to each of the first and second blue emissive stacks BS1 and BS2, whereby it is possible to improve the efficiency and lifespan of the white light-emitting device.

Charge generation layers CGL1, CGL2, and CGL3 configured to supply holes and electrons to emissive stacks distant from electrodes may be further provided between emissive stacks BS1, PS, BS2, and BS3.

A plural-stack tandem structure described with reference to FIGS. 5A and 5B is configured to maximize the efficiency of the white light-emitting device, whereby more vivid display is possible.

Also, in a white organic light-emitting device according to another embodiment of the present invention, as shown in FIG. 5B, a first blue emissive stack BS1, a phosphorescent emissive stack PS, a second blue emissive stack BS2, and a third blue emissive stack BS3 sequentially provided between a first electrode 110 and a second electrode 170.

Depending on circumstances, the position of the phosphorescent emissive stack PS may be changed.

Meanwhile, although the three-emissive-stack structure or the four-emissive-stack structure is included between the first electrode 110 and the second electrode 170 in the above examples, a blue emissive stack structure and/or a phosphorescent emissive stack structure may be further included in order to further improve luminous efficiency.

Hereinafter, an example in which the white organic light-emitting device is applied to a display device will be described.

Figure 6:
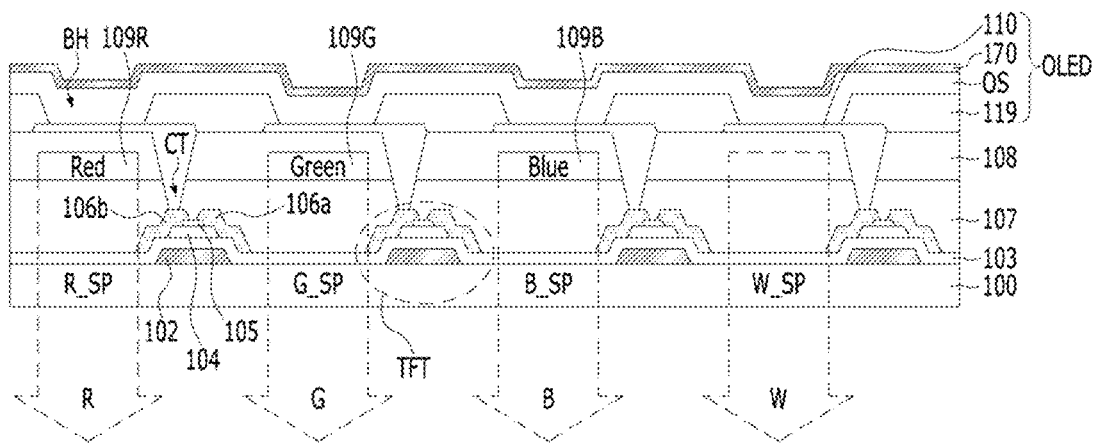
FIG. 6 is a sectional view showing a display device including a white organic light-emitting device according to the present invention.

FIG. 6 is a sectional view showing a display device including a white organic light-emitting device according to the present invention.

As shown in FIG. 6, the display device according to the present invention may include a substrate 100 having a plurality of subpixels R_SP, G_SP, B_SP, and W_SP, the light-emitting device of FIG. 1 commonly provided at the subpixels R_SP, G_SP, B_SP, and W_SP of the substrate 100, a thin film transistor TFT provided at each of the subpixels, the thin film transistor being connected to the first electrode 110 of the white organic light-emitting device (OLED), and color filter layers 109R, 109G, and 109B provided under the first electrode 110 of at least one of the subpixels. In FIG. 6, R indicates red, G indicates green, B indicates blue, and W indicates white.

In the shown example, the white subpixel W_SP is included. However, the present invention is not limited thereto. Only the red, green, and blue subpixels R_SP, G_SP, and B_SP may be included while the white subpixel W_SP is omitted. Depending on circumstances, a combination of a cyan subpixel, a magenta subpixel, and a yellow subpixel capable of expressing white light may be used instead of the red, green, and blue subpixels.

As an example, the thin film transistor TFT includes a gate electrode 102, a semiconductor layer 104, and a source electrode 106a and a drain electrode 106b connected to opposite sides of the semiconductor layer 104.

A gate dielectric film 103 is provided between the gate electrode 102 and the semiconductor layer 104.

The semiconductor layer 104 may be constituted, for example, by amorphous silicon, crystalline silicon, an oxide semiconductor, or a combination of two or more thereof. For example, in the case in which the semiconductor layer 104 is an oxide semiconductor, an etch stopper 105 may be further provided so as to directly abut the semiconductor layer 104 in order to prevent damage to a channel region of the semiconductor layer 104.

In addition, the drain electrode 106b of the thin film transistor TFT may be connected to the first electrode 110 in a contact hole CT region provided in first and second passivation films 107 and 108.

The first passivation film 107 is provided to primarily protect the thin film transistor TFT, and the color filters 109R, 109G, and 109B may be provided on the first passivation film.

When the plurality of subpixels includes a red subpixel, a green subpixel, a blue subpixel, and a white subpixel, the color filter layers are provided at the remaining subpixels excluding the white subpixel W_SP as first to third color filters 109R, 109G, and 109B in order to pass white light that exits through the first electrode 110 for each wavelength. The second passivation film 108 is formed under the first electrode 110 so as to cover the first to third color filters 109R, 109G, and 109B. The first electrode 110 is formed at the surface of the second passivation film 108 excluding the contact hole CT.

Here, the white organic light-emitting device (OLED) may include a first electrode 110, which is a transparent electrode, a second electrode 170, which is a reflective electrode, the second electrode being opposite the first electrode, and a two-stack structure including a blue emissive stack and a long-wavelength (red and green or Yellow green colors) (phosphorescence) emissive stack provided between the first and second electrodes 110 and 170, or a three-stack structure including a first blue emissive stack BS1, a phosphorescent emissive stack PS, and a second blue emissive stack BS2 provided between the first and second electrodes 110 and 170, as shown in FIG. 5A. Alternatively, in an organic stack OS, at least one of the blue emissive stack and the phosphorescent emissive stack may be provided in plural, and a charge generation layer may be provided between the emissive stacks. In this case, the plurality of emissive stacks may have the same structure.

Reference numeral 119 indicates banks, and BH means a bank hole between the banks. Light is emitted in a region opened through the bank hole. The bank hole defines an emissive portion of each subpixel.

Meanwhile, the display device of FIG. 6 is a downward light emission type display device.

However, the present invention is not limited thereto. The display device may be realized as a downward light emission type display device, in which the color filter layer is located on the second electrode 170, the first electrode 110 includes a reflective metal, and the second electrode 170 is constituted by a transparent electrode or a semi-transmissive metal.

Alternatively, the color filter layer may be omitted or provided, and both the first and second electrodes 110 and 170 may be constituted by transparent electrodes, whereby a transparent organic light-emitting device may be realized.

A light-emitting device according to an embodiment of the present invention includes an electron blocking layer, a first emissive layer, a second emissive layer, and an electron transport layer, which are sequentially disposed, between a first electrode and a second electrode, which are opposite each other. The first emissive layer includes a first host and a first blue dopant. The second emissive layer includes a second host and a second blue dopant. The triplet energy level of the first host may be greater than the triplet energy level of the second host. The triplet energy level of the first blue dopant may be greater than the triplet energy level of the first host.

The first blue dopant and the second blue dopant may be the same materials. The triplet energy level of the second host may be less than 2.0 eV, and the triplet energy level of the first host may be greater than 2.0 eV.

The singlet energy level of the first host may be greater than the singlet energy level of the second host, and the singlet energy level of the second host may be greater than the singlet energy level of the first blue dopant.

The first host may be p-type or bipolar, and hole mobility of the first host may be greater than hole mobility of the second host.

The first emissive layer and the second emissive layer may abut each other, and the thickness of the second emissive layer may be equal to or greater than the thickness of the first emissive layer.

The HOMO level of the first host may be −6.0 eV to −5.6 eV, the LUMO level of the first host may be higher than −2.6 eV, and the LUMO level of the first blue dopant may be lower than the LUMO level of the first host.

The triplet energy level of the second blue dopant may be less than the triplet energy level of the first host and may be greater than the triplet energy level of the second host.

The HOMO level of the first dopant may be greater than −5.3 eV. The emission spectrum of the first blue dopant and the absorption spectrum of the second blue dopant may overlap each other.

The first host may include a naphthalene moiety, and the second host may include one of anthracene, pyrene, and phenanthrene.

The thickness ratio of the first emissive layer to the second emissive layer may be 1:9 to 6:4.

A mixture layer constituted by the first host, the second host, and the first blue dopant may be further included between the first emissive layer and the second emissive layer.

A display device according to an embodiment of the present invention includes above light-emitting device.

In addition, a display device according to an embodiment of the present invention includes a plurality of subpixels, a thin film transistor provided for each subpixel, and a blue stack connected to the thin film transistor at each subpixel, the blue stack including a hole transport layer, an electron blocking layer, a first emissive layer, a second emissive layer, and an electron transport layer, which are sequentially disposed so as to abut each other, between a first electrode and a second electrode, which are opposite each other, wherein the first emissive layer includes a first host and a first blue dopant, and the second emissive layer includes a second host and a second blue dopant. The triplet energy level of the first host may be greater than the triplet energy level of the second host, and the triplet energy level of the first blue dopant may be greater than the triplet energy level of the first host.

The blue stack may be provided in plural between the first electrode and the second electrode. At least one of the blue stacks may be disposed between the first electrode and the second electrode in the state in which a phosphorescent emissive stack including two or more phosphorescent emissive layers, each of which has a longer wavelength than the blue stack, and a charge generation layer are interposed between the blue stacks.

A light-emitting device according to another embodiment of the present invention may include: a first electrode, a hole transport layer disposed on the first electrode, a first emissive layer disposed on the hole transport layer, a second emissive layer disposed directly on the first emissive layer, and an electron transport layer disposed on the second emissive layer, and a second electrode disposed on the electron transport layer, wherein the first emissive layer comprises a first host and a first blue dopant, the second emissive layer comprises a second host and a second blue dopant, a triplet energy level of the first host is greater than a triplet energy level of the second host, and a triplet energy level of the first blue dopant is greater than the triplet energy level of the first host.

The first blue dopant and the second blue dopant may be identical materials, and the triplet energy level of the second host may be less than 2.0 eV, and the triplet energy level of the first host is greater than 2.0 eV.

A singlet energy level of the first host may be greater than a singlet energy level of the second host, and the singlet energy level of the second host may be greater than a singlet energy level of the first blue dopant, and a triplet energy level of the second blue dopant may be less than the triplet energy level of the first host and may be greater than the triplet energy level of the second host.

A thickness of the second emissive layer may be equal to or greater than a thickness of the first emissive layer.

As is apparent from the above description, a light-emitting device according to the present invention and a display device including the same have the following effects.

First, an emissive layer configured to emit blue light is formed so as to have a dual-layer structure, the triplet energy level of a dopant of a first emissive layer adjacent to a hole transport layer is greater than the triplet energy level of a first host in the first emissive layer, and the triplet energy level of the first host is greater than the triplet energy level of a second host of a second emissive layer, whereby triplet excitons generated in the first emissive layer are recycled to the second emissive layer so as to be reused for light emission. That is, excitons or electrons may be prevented from accumulating at the interface between the hole transport layer or an electron blocking layer and the emissive layer. Consequently, it is possible to improve efficiency of the light-emitting device and to remarkably increase lifespan of the light-emitting device.

Second, the first emissive layer adjacent to the hole transport layer has a host having hole transportability, whereby holes are pushed to the second emissive layer. Consequently, the recycling rate of triplet excitons in the second emissive layer is increased, whereby it is possible to prevent excitons or electrons from accumulating at the interface between the hole transport layer or the electron blocking layer and the first emissive layer, and therefore it is possible to increase the lifespan of the hole transport layer or the electron blocking layer.

Third, continuous recycling from the first emissive layer to the second emissive layer, which constitutes a plural-layer structure with the first emissive layer, is performed, whereby it is possible to maintain high efficiency, and therefore it is possible to increase the lifespan of the light-emitting device and the display device and to stabilize the device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light-emitting device comprising:
a first electrode, an electron blocking layer, a first emissive layer, a second emissive layer, and an electron transport layer, and a second electrode, which are sequentially disposed, wherein
the first emissive layer comprises a first host and a first blue dopant,
the second emissive layer comprises a second host and a second blue dopant,
a triplet energy level of the first host is greater than a triplet energy level of the second host,
a triplet energy level of the first blue dopant is greater than the triplet energy level of the first host,
a singlet energy level of the first host is greater than a singlet energy level of the second host, and
the singlet energy level of the second host is greater than a singlet energy level of the first blue dopant.

2. The light-emitting device according to claim 1, wherein the first blue dopant and the second blue dopant are identical materials,
the triplet energy level of the second host is less than 2.0 eV, and
the triplet energy level of the first host is greater than 2.0 eV.

3. The light-emitting device according to claim 1, wherein the first host is p-type or bipolar, and
hole mobility of the first host is greater than hole mobility of the second host.

4. The light-emitting device according to claim 1, wherein the first emissive layer is in contact with the second emissive layer, and
a thickness of the second emissive layer is equal to or greater than a thickness of the first emissive layer.

5. The light-emitting device according to claim 1, wherein a LUMO energy level of the first blue dopant is lower than a LUMO energy level of the first host.

6. The light-emitting device according to claim 1, wherein a triplet energy level of the second blue dopant is less than the triplet energy level of the first host and is greater than the triplet energy level of the second host.

7. The light-emitting device according to claim 6, wherein a HOMO level of the first dopant is greater than −5.3 eV, and
an emission spectrum of the first blue dopant and an absorption spectrum of the second blue dopant overlap each other.

8. The light-emitting device according to claim 1, wherein the first host comprises a naphthalene moiety, and
the second host comprises one of anthracene, pyrene, and phenanthrene.

9. The light-emitting device according to claim 1, wherein a thickness ratio of the first emissive layer to the second emissive layer is 1:9 to 6:4.

10. The light-emitting device according to claim 1, further comprising:
a mixture layer provided between the first emissive layer and the second emissive layer, the mixture layer including the first host, the second host, and the first blue dopant.

11. A display device comprising:
a plurality of subpixels;
a thin film transistor provided for each subpixel; and
one or more blue stacks connected to the thin film transistor at each subpixel, each of the blue stacks comprising a hole transport layer, an electron blocking layer, a first emissive layer, a second emissive layer, and an electron transport layer, which are sequentially disposed between a first electrode and a second electrode, the first electrode and the second electrode being opposite each other, wherein
the first emissive layer comprises a first host and a first blue dopant,
the second emissive layer comprises a second host and a second blue dopant,
a triplet energy level of the first host is greater than a triplet energy level of the second host, and
a triplet energy level of the first blue dopant is greater than the triplet energy level of the first host,
a singlet energy level of the first host is greater than a singlet energy level of the second host, and
the singlet energy level of the second host is greater than a singlet energy level of the first blue dopant.

12. The display device according to claim 11, wherein the first blue dopant and the second blue dopant are identical materials,
the triplet energy level of the second host is less than 2.0 eV, and
the triplet energy level of the first host is greater than 2.0 eV.

13. The display device according to claim 11, wherein the first host is p-type or bipolar, and
hole mobility of the first host is greater than hole mobility of the second host.

14. The display device according to claim 11, wherein a thickness of the second emissive layer is equal to or greater than a thickness of the first emissive layer.

15. The display device according to claim 11, wherein a phosphorescent emissive stack comprising two or more phosphorescent emissive layers, each of which has a longer wavelength than the blue stack, and a charge generation layer are interposed between the blue stacks.

16. A light-emitting device comprising:
a first electrode;
a hole transport layer disposed on the first electrode;
a first emissive layer disposed on the hole transport layer;
a second emissive layer disposed directly on the first emissive layer; and
an electron transport layer disposed on the second emissive layer; and
a second electrode disposed on the electron transport layer, wherein
the first emissive layer comprises a first host and a first blue dopant,
the second emissive layer comprises a second host and a second blue dopant,
a triplet energy level of the first host is greater than a triplet energy level of the second host, and a triplet energy level of the first blue dopant is greater than the triplet energy level of the first host,
a singlet energy level of the first host is greater than a singlet energy level of the second host, and
the singlet energy level of the second host is greater than a singlet energy level of the first blue dopant.

17. The light-emitting device according to claim 16, wherein the first blue dopant and the second blue dopant are identical materials, and the triplet energy level of the second host is less than 2.0 eV, and the triplet energy level of the first host is greater than 2.0 eV.

18. The light-emitting device according to claim 16, wherein a triplet energy level of the second blue dopant is less than the triplet energy level of the first host and is greater than the triplet energy level of the second host.

19. The light-emitting device according to claim 16, wherein a thickness of the second emissive layer is equal to or greater than a thickness of the first emissive layer.

* * * * *